United States Patent
Yu (12)

(10) Patent No.: US 6,537,868 B1
(45) Date of Patent: Mar. 25, 2003

(54) METHOD FOR FORMING NOVEL LOW LEAKAGE CURRENT CASCADED DIODE STRUCTURE

(75) Inventor: Ta-Lee Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/991,310

(22) Filed: Nov. 16, 2001

(51) Int. Cl.[7] .......................................... H01L 21/8234
(52) U.S. Cl. ....................................... 438/237; 438/238
(58) Field of Search ................................. 438/238, 237

(56) References Cited

U.S. PATENT DOCUMENTS

| | | | |
|---|---|---|---|
| 5,477,414 A | 12/1995 | Li et al. .................... 361/56 |
| 5,500,546 A | * 3/1996 | Marum et al. ............... 257/358 |
| 5,530,612 A | 6/1996 | Maloney ....................... 361/56 |
| 5,616,943 A | * 4/1997 | Nguyen et al. .............. 257/203 |
| 5,689,133 A | 11/1997 | Li et al. ...................... 257/361 |
| 5,856,214 A | 1/1999 | Yu .............................. 438/133 |
| 6,051,457 A | 4/2000 | Ito ............................. 438/208 |
| 6,057,184 A | 5/2000 | Brown et al. ................ 438/199 |
| 6,169,301 B1 | 1/2001 | Ishikawa et al. ............ 257/275 |

* cited by examiner

Primary Examiner—Jey Tsai
(74) Attorney, Agent, or Firm—George O. Saile; Stephen B. Ackerman

(57) ABSTRACT

A cascaded diode acting as an ESD protection device with reduced substrate leakage current is disclosed. The cascaded diode is composed of a chain of coupled similar elemental diodes, each composed of an n-well in a p-substrate, the n-well having p regions and n regions, and a deep n-well disposed under and connected to the n-well. The first elemental diode has its p region electrically connected to a pin or pad that is the higher potential end of a portion of an integrated circuit to be protected, its n region electrically connected to the p region of an intermediate elemental diode. The p region of an intermediate diode is connected electrically to the n region of the preceding elemental diode and the n region of an intermediate elemental diode is connected electrically to the p region of the following elemental diode. A last elemental diode has its p region electrically connected to the n region of the preceding elemental diode and its n region electrically connected to a pad or pin that is the end of the portion of an integrated circuit.

19 Claims, 5 Drawing Sheets

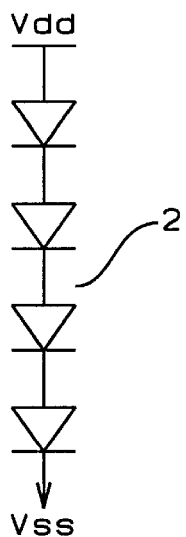
FIG. 1 - Prior Art
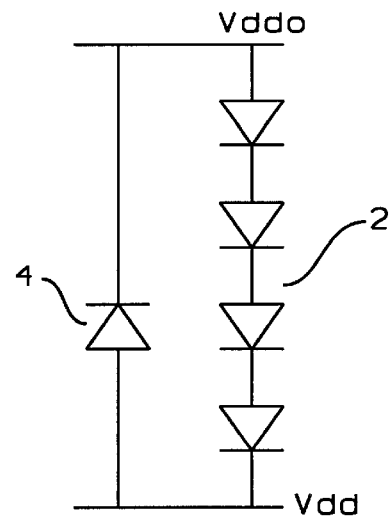
FIG. 2 - Prior Art
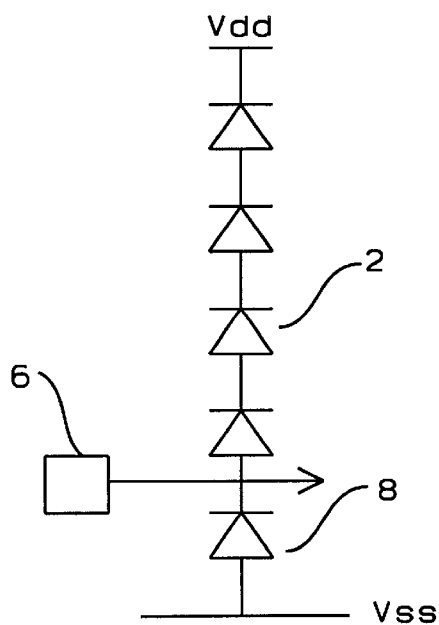
FIG. 3 - Prior Art

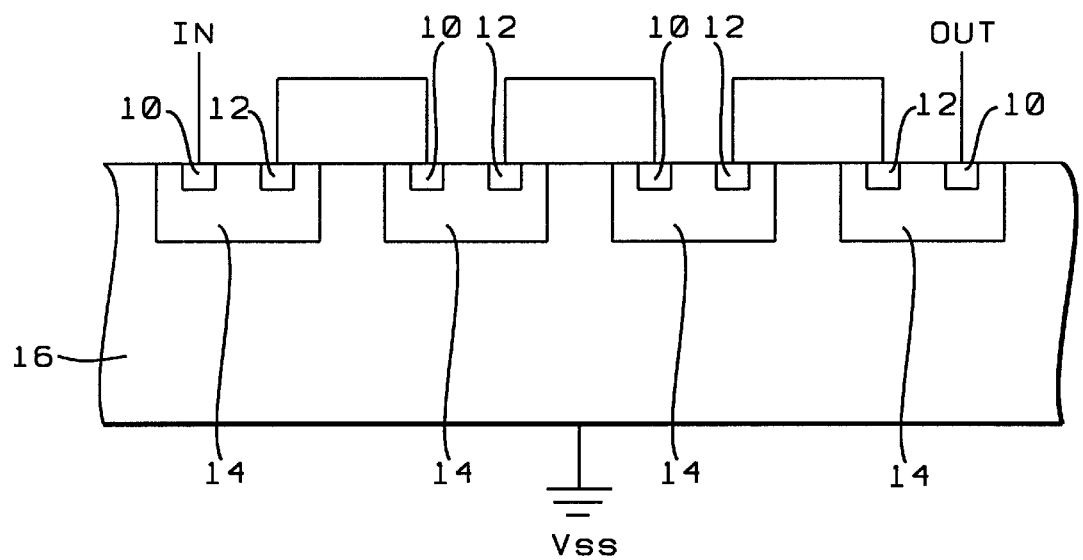
*FIG. 4 – Prior Art*
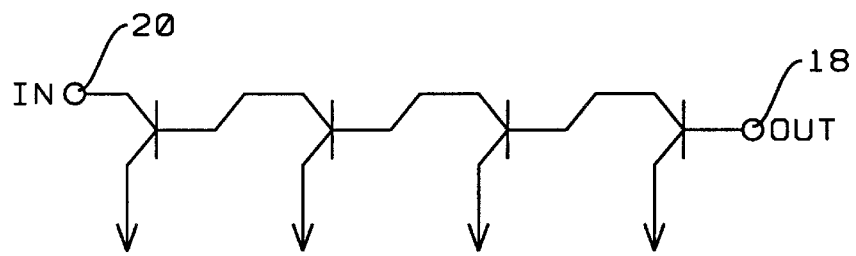
*FIG. 5 – Prior Art*
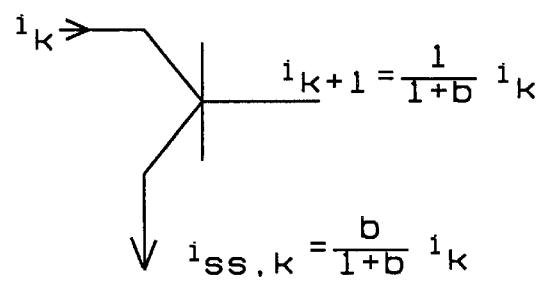
*FIG. 6 – Prior Art*

METHOD FOR FORMING NOVEL LOW LEAKAGE CURRENT CASCADED DIODE STRUCTURE

BACKGROUND OF THE INVENTION (1) Field of the Invention

The present invention relates generally to semiconductor integrated circuit manufacturing and more particularly to methods and structures for protecting integrated circuits from electrostatic discharge.

(2) Description of Prior Art

Electrostatic discharge (ESD) is a phenomenon that occurs during handling of semiconductor integrated circuit devices, which may lead to destructive effects on such devices. Various circuits have been disclosed that provide protection from ESD. Li et al. In U.S. Pat. No. 5,477,414 and U.S. Pat. No. 5,689,133 propose an ESD protection circuit that combines a split bipolar transistor with a transistor layout, which exhibits tolerance to ESD events. A method of fabricating low voltage zener-triggered silicon controlled rectifier for ESD protection in integrated circuits is disclosed in U.S. Pat. No. 5,856,214 to Yu. A method for fabricating an ESD protection device is disclosed in U.S. Pat. No. 6,051,457 to Ito, in which the ESD protection device can be incorporated in an integrated circuit with a passive component or with an active component. U.S. Pat. No. 6,057,184 to Brown et al. and U.S. Pat. No. 6,169,301 to Ishikawa et al. are related patents.

Cascaded diode structures, also called diode strings, are commonly used non-breakdown ESD protection devices. Typical applications are for Vdd to Vss clamps, coupling clamps Vdd to Vdd0, Vss to Vss0 and high voltage tolerant I/O. These are shown in FIGS. 1–3, where for purposes of illustration the number of diodes in the cascaded diode structures, 2, is taken to be 4. The single diode, 4, in FIG. 2 represents the n junction on the p-substrate. Region 6 of FIG. 3 is an I/O pad and the diode 8 represents an ESD protection device.

The cascaded diode structure is shown in FIG. 4, where p, 10, and n, 12, regions are implanted in n-wells, 14, formed in a p-substrate, 16, and, except for the in and out regions, n and p regions of successive n-wells are electrically connected. Because the n-wells form rectifying junctions with the p-substrate, the cascaded diode made in this way actually forms a chain of Darlington coupled PNP transistors, as shown in FIG. 5. Referring to FIG. 6, there is presented the relationship of the transistor currents at any stage, k, of the cascaded diode structure in terms of the PNP bipolar current gain, b. The current into the k transistor is $I_k$, the current into the substrate from the k transistor is $(b/1+b)I_k$ and the current into the (k+1) transistor is $(1/1+b)I_k=I_{k+1}$. If there are m transistors, then the current out of the cascaded diode structure, $I_{out}$, not passing into the substrate, is related to the current into the cascaded diode structure, $I_{in}$ by $I_{out}=I_{in}(1+b)^m$. The current into the substrate from all the transistors, $I_{ss}$, is the difference, $I_{in}-I_{out}$ and thus $I_{ss}=I_{in}(1-(1/1+b)^m$. It is seen that when b is large almost all the current passes into the substrate. For example, for b=1 and m=4, $15/16$ of the current passes into the substrate. Since potential differences exist across cascaded diode structures during normal operation, and not just under EDS events, such large substrate leakage currents can pose serious problems. Maloney, in U.S. Pat. No. 5,530,612, proposes techniques to alleviate this problem by utilizing circuitry in addition to cascaded diode structures. This invention shows that modifying the cascaded diode structure can substantially diminish the substrate leakage current, without introducing other circuit elements.

SUMMARY OF THE INVENTION

It is a primary objective of the invention to provide modifications in the structure of the cascaded diode that results in substantial reduction of substrate leakage current. Such reduction is accomplished by significantly reducing the PNP bipolar current gain by means of a deep n-well under the n-well of the usual cascaded diode structure. The gain is reduced to much less than unity when the PNP base width is doubled by the added deep n-well and the base concentration is increased. Consequently the substrate leakage current is greatly reduced.

A cascaded diode acting as an EDS protection device with reduced substrate leakage current is disclosed. The cascaded diode is composed of a chain of coupled similar elemental diodes, each composed of an n-well in a p-substrate, the n-well having p regions and n regions, and a deep n-well disposed under and connected to the n-well. The first elemental diode has its p region electrically connected to a pin or pad that is the higher potential end of a portion of an integrated circuit to be protected, its n region electrically connected to the p region of an intermediate elemental diode. The p region of an intermediate diode is connected electrically to the n region of the preceding elemental diode and the n region of an intermediate elemental diode is connected electrically to the p region of the following elemental diode. A last elemental diode has its p region electrically connected to the n region of the preceding elemental diode and its n region electrically connected to a pad or pin that is the end of the portion of an integrated circuit.

BRIEF DESCRIPTION OF THE DRAWINGS

In the accompanying drawing forming a material part of this description, there is shown:

FIGS. 1, 2 and 3 show typical applications of cascaded diode structures.

FIG. 4 shows a conventional cascaded diode structure.

FIG. 5 shows the Darlington chain of coupled bipolar PNP transistors appropriate for a cascaded diode structure.

FIG. 6 shows the relationships between the bipolar PNP transistor currents.

DESCRIPTION OF THE PREFERRED EMBODIMENTS

Figure 7:
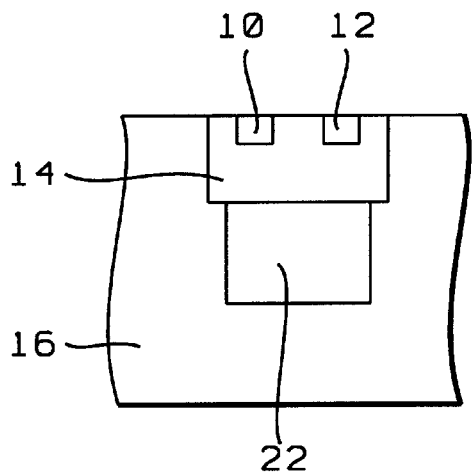
FIG. 7 shows a diode according to the invention.
Figure 8:
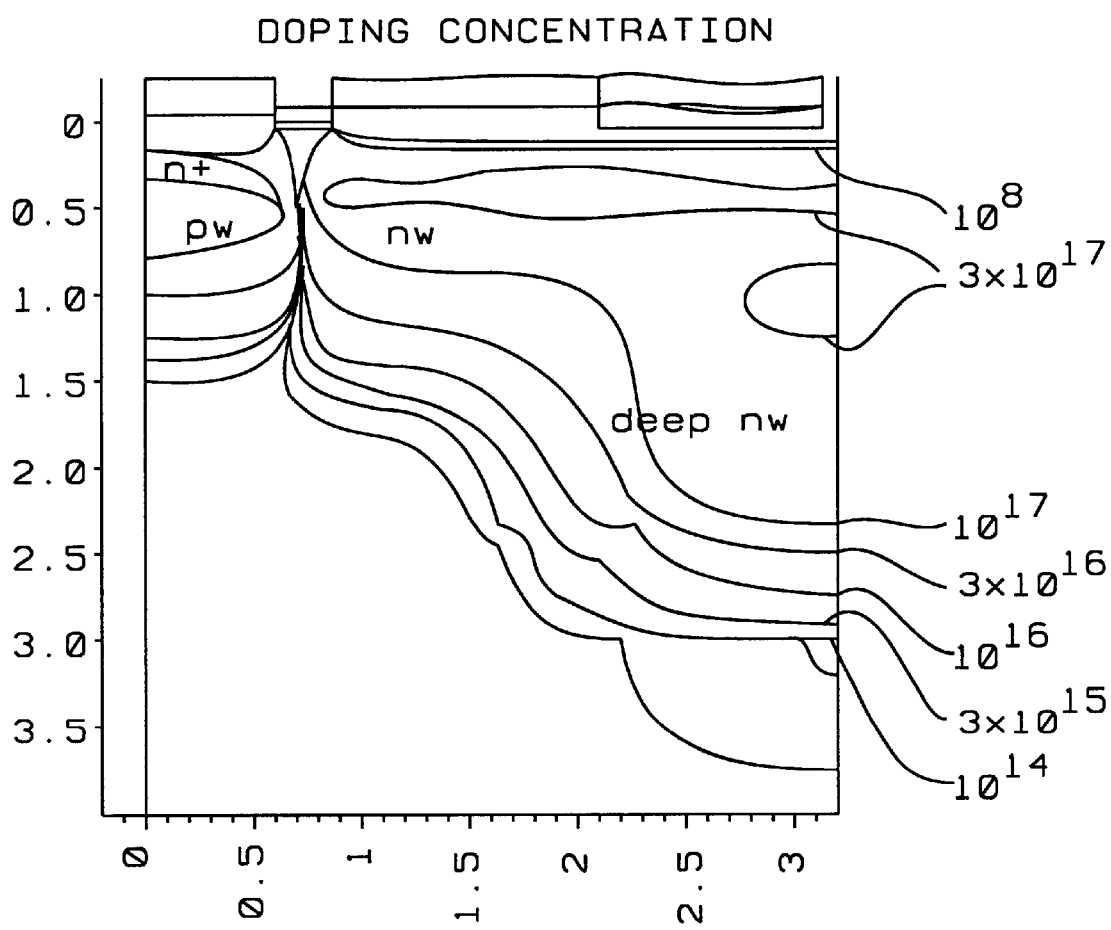
FIG. 8 shows a doping distribution for an n-well plus deep n-well.
Figure 9:
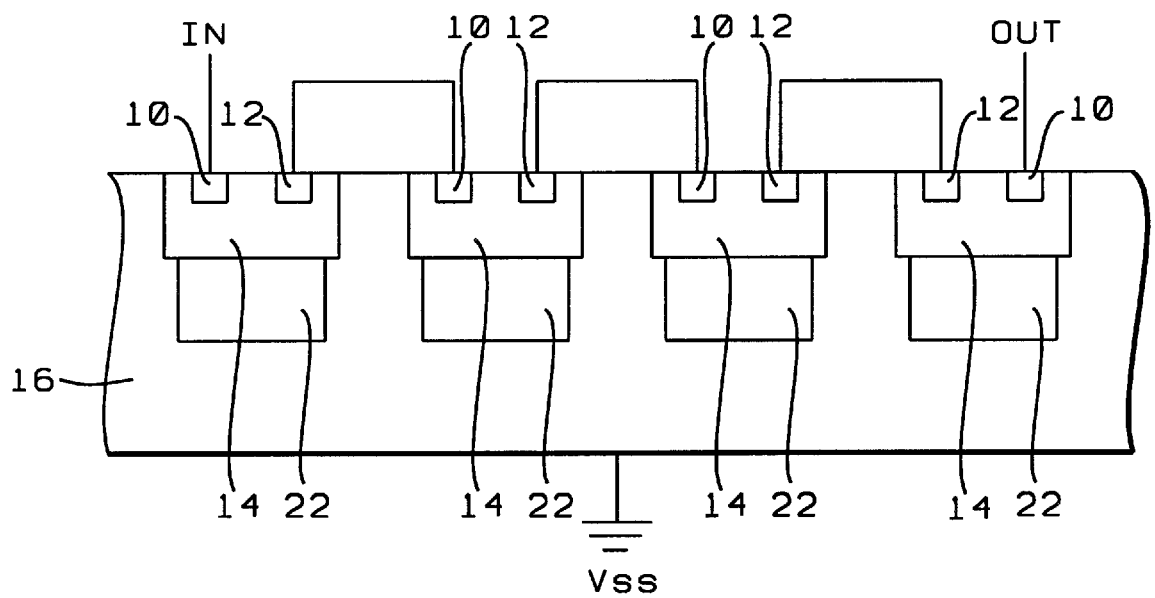
FIG. 9 shows a cascaded diode of the invention.
Figure 10:
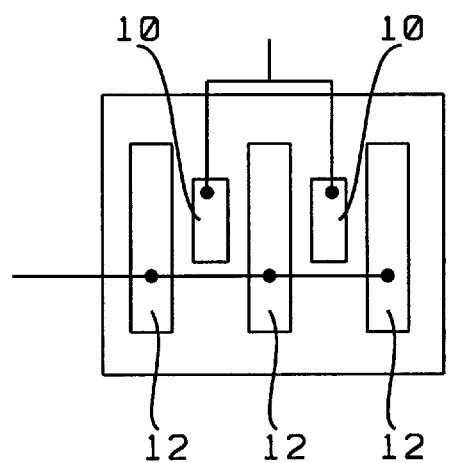
FIG. 10 shows a top view of a diode according to the invention.
Figure 11A:
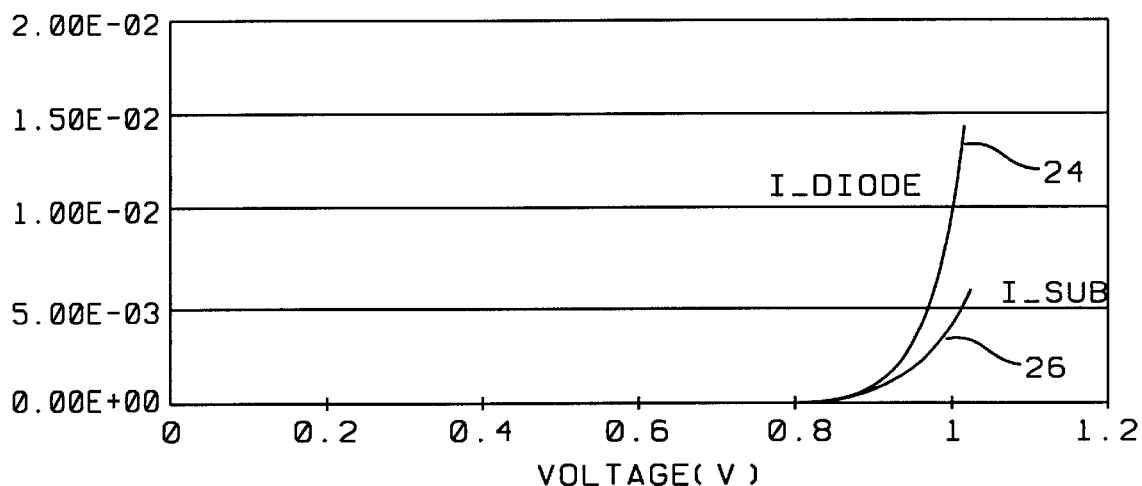
FIGS. 11a and 11b show currents for cascaded diodes without and with deep n-wells.
Figure 11B:
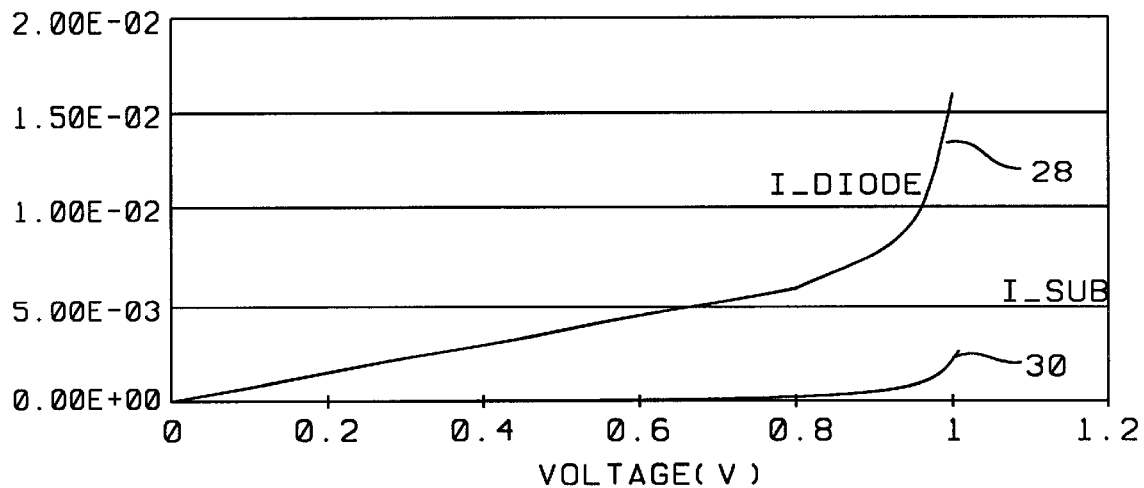

The invention provides a structure for a cascaded diode that significantly reduced substrate current leakage and a method to achieve the structure that is compatible with CMOS technology. Reduced substrate current results when the PNP bipolar current gain, b, is reduced. For a cascaded diode composed of a chain of m diodes, with a PNP bipolar current gain of b at each, and for a cascaded diode input current, $I_{in}$, the substrate current, $I_{ss}$, is given by $I_{ss}=I_{in}(1-$ ($\frac{1}{1+b}$)$^m$). This clearly indicates that a reduction in b results in a reduction in substrate current. For example, with m=4 the ratio of substrate current to input current is 0.99 for b=2, 0.94 for b=1, 0.52 for b=0.2 and 0.31 for b=0.1. The invention provides a modification in the conventional cascaded diode structure that decreases the PNP bipolar current gain and consequently the substrate current. Referring to FIG. 7, there is shown a diode according to the invention, which when cascaded, as in FIG. 9, forms a cascaded diode of the invention. As in a conventional diode element of a cascaded diode, there are p regions, 10, and n regions, 12 formed in an n well; the additional deep n-well region, 22, is a modification of the invention. In preferred embodiments of the invention the deep n-well, 22, is formed to a depth of about 3 micrometers. This can be accomplished in several ways; for example, by a single 2 MeV phosphorus implant to a dose of about 2.1E13 per cm$^2$ or by two phosphorus implants, a 2MeV implant to a dose of about 2E13 per cm$^2$ and a 1MeV implant to a dose of about 2E12 per cm$^2$. A 200 KeV phosphorus implant to a dose of about 1.3E13 per cm$^2$ forms the n-well, 14, to a depth of about 1.5 micrometers. In addition to an increase in the PNP base width an increase in doping concentration overall results from the added implants. Both the increased base width and increased doping concentration lead to a decrease in the PNP bipolar current gain, b. FIG. 8 shows a doping distribution for an n-well plus deep n-well regions formed under the following implant conditions: phosphorus implants of, 200 keV to a dose of 1.3E13 per cm$^2$, 2MeV to a dose of 2E13 per cm$^2$ and 1MeV to a dose of 2E12 per cm$^2$. A cascaded diode according to the invention is shown FIG. 9, although 4 diodes are shown in the chain, the chain can have any number of diodes. FIG. 10 presents a top view of a single diode, an element of a cascaded diode of the invention. To obtain a desired area efficiently a multiplicity of thin finger-like n-regions, 12, and of p-regions, 10, are formed in each n-well. The n-regions of a well are connected electrically and the p-regions of a well are connected electrically. Thus the p-region, 10, of an n-well in FIGS. 7 and 9 actually represents the connected multiplicity of finger-like p-regions of an n-well, and similarly, the n-region, 10, of an n-well in FIGS. 7 and 9 actually represents the connected multiplicity of finger-like n-regions of an n-well. Output currents and substrate currents for cascaded diodes that are alike in all respects except that one, shown in FIG. 11a, is without a deep n-well and the other, shown in FIG. 11b, with a deep n-well. Substantially larger substrate currents are seen for the cascaded diode of FIG. 11a, that without the deep n-well, than for the cascaded diode of FIG. 11b, that with a deep n-well. As expected, the PNP bipolar current gain of the deep n-well cascaded diode of FIG. 11b is about 0.2, much smaller than the PNP bipolar current gain of the conventional cascaded diode of FIG. 11a, which is about 1.

A deep n-well cascaded diode of the invention is a simple and practical structure that is usable in CMOS technology without undesirably large substrate currents. The very low PNP bipolar current gain achieved with a deep n-well essentially eliminates bipolar transistor characteristics so that a deep n-well cascaded diode of the invention will practically act as a chain of diodes. The total voltage drop across a deep n-well cascaded diode is thus distributed quite evenly over the individual diodes. Deep n-well cascaded diodes are effective in isolating substrate noise and SER, especially for 0.1-micrometer technologies and beyond. In addition, deep n-well cascaded diodes of the invention provide improved ESD protection.

While the invention has been particularly shown and described with reference to the preferred embodiments thereof, it will be understood by those skilled in the art that various changes in form and detail may be made without departing from the spirit and scope of the invention.

What is claimed is:

1. A method for forming a cascaded diode providing ESD protection to portions of integrated circuits with reduced substrate leakage current, said cascaded diode being a chain of coupled elemental diodes, comprising:

fabricating elemental diodes by forming for each diode, an n-well in a p-substrate, a p region and an n region in the n-well, and forming a deep n-well disposed under and connected to the n-well, so that the bi-polar PNP current gain is less than one;

connecting electrically the p region of a first elemental diode to a pin or pad at the higher potential side of said portion of an integrated circuit to be protected and the n region of said first elemental region to the p region of the following intermediate elemental diode;

connecting electrically the p region of an intermediate diode to the n region of the preceding elemental diode and said n region of an intermediate elemental diode to the p region of the following elemental diode;

connecting electrically the p region a last elemental diode to the n region of the preceding elemental diode and its said n region to the other end of said portion of an integrated circuit.

2. The method of claim 1 wherein the number of elemental diodes is between 1 and 10.

3. The method of claim 1 wherein the n-well is formed by the implantation of phosphorus ions.

4. The method of claim 1 wherein the deep n-well is formed either by a single or by a double implantation of phosphorus ions.

5. A method for forming a cascaded diode acting as a Vdd-to-Vss clamp with reduced substrate leakage current and providing ESD protection, said cascaded diode being a chain of coupled elemental diodes, comprising:

fabricating elemental diodes by forming for each diode, an n-well in a p-substrate, a p region and an n region in the n-well, and forming a deep n-well disposed under and connected to the n-well, so that the bi-polar PNP current gain is less than one;

connecting electrically the p region of a first elemental diode to Vdd, the n region of said first elemental region to the p region of the following intermediate elemental diode;

connecting electrically the p region of an intermediate diode to the n-region of the preceding elemental diode and said n region of an intermediate elemental diode to the p region of the following elemental diode;

connecting electrically the p region a last elemental diode to the n region of the preceding elemental diode and its said n region to Vss.

6. The method of claim 5 wherein the number of elemental diodes is between 1 and 10.

7. The method of claim 5 wherein the n-well is formed by the implantation of phosphorus ions.

8. The method of claim 5 wherein the deep n-well is formed by either a single or by a double implantation of phosphorus ions.

9. A method for forming a cascaded diode acting as a coupling clamp, Vdd-to-Vddo or Vss-to-Vsso, with reduced substrate leakage current and providing ESD protection, said cascaded diode being a chain of coupled elemental diodes, comprising:

fabricating elemental diodes by forming for each diode, an n-well in a p-substrate, a p region and an n region in the n-well, and forming a deep n-well disposed under and connected to the n-well, so that the bi-polar PNP current gain is less than one;

connecting electrically the p region of a first elemental diode to Vddo, for Vdd-to-Vddo, or to Vsso, for Vss-to-Vsso, and the n region of said first elemental region to the p region of the following intermediate elemental diode;

connecting electrically the p region of an intermediate diode to the n region of the preceding elemental diode and said n region of an intermediate elemental diode to the p region of the following elemental diode;

connecting electrically the p region a last elemental diode to the n region of the preceding elemental diode and its said n region to Vdd, for Vdd-to-Vddo, or Vss, for Vss-to-Vsso.

10. The method of claim 9 wherein the number of elemental diodes is between 1 and 10.

11. The method of claim 9 wherein the n-well is formed by the implantation of phosphorus ions.

12. The method of claim 9 wherein the deep n-well is formed either by single or by a double implantation of phosphorus ions.

13. A method for forming a cascaded diode acting as a high-voltage-tolerant I/O-to-Vdd clamp, with reduced substrate leakage current and providing ESD protection, said cascaded diode being a chain of coupled elemental diodes, comprising:

fabricating elemental diodes by forming for each diode, an n-well in a p-substrate, a p region and an n region in the n-well, and forming a deep n-well disposed under and connected to the n-well, so that the bi-polar PNP current gain is less than one;

connecting electrically the p region of a first elemental diode to a high-voltage-tolerant I/O pad, and the n region of said first elemental region to the p region of the following intermediate elemental diode;

connecting electrically the p region of an intermediate diode to the n region of the preceding elemental diode and said n region of an intermediate elemental diode to the p region of the following elemental diode;

connecting electrically the p region a last elemental diode to the n region of the preceding elemental diode and its said n region to Vdd.

14. The method of claim 13 wherein the number of elemental diodes is between 1 and 10.

15. The method of claim 13 wherein the n-well is formed by the implantation of phosphorus ions.

16. The method of claim 13 wherein the deep n-well is formed either by a single or by a double implantation of phosphorus ions.

17. A method for forming a diode comprising:

forming an n-well in a p-substrate;

forming p regions and n regions in the n-well;

forming a deep n-well disposed under and connected to the n-well, so that bi-polar PNP current gain of a Darlington transistor formed thereby is less than one.

18. The method of claim 17 wherein the n-well is formed by the implantation of phosphorous ions.

19. The method of claim 17 wherein the deep n-well is formed either by a single or by a double implantation of phosphorus ions.

* * * * *